(12) United States Patent
Shin et al.

(10) Patent No.: US 12,105,138 B2
(45) Date of Patent: Oct. 1, 2024

(54) TEST SOCKET

(71) Applicant: LEENO INDUSTRIAL INC., Busan (KR)

(72) Inventors: Young taek Shin, Busan (KR); Byeong cheol Lee, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 127 days.

(21) Appl. No.: 17/928,867

(22) PCT Filed: May 28, 2021

(86) PCT No.: PCT/KR2021/006641
§ 371 (c)(1),
(2) Date: Nov. 30, 2022

(87) PCT Pub. No.: WO2021/246719
PCT Pub. Date: Dec. 9, 2021

(65) Prior Publication Data
US 2023/0228808 A1 Jul. 20, 2023

(30) Foreign Application Priority Data
Jun. 1, 2020 (KR) .......................... 10-2020-0065853

(51) Int. Cl.
*G01R 31/28* (2006.01)
*G01R 1/04* (2006.01)
(Continued)

(52) U.S. Cl.
CPC ....... *G01R 31/2863* (2013.01); *G01R 1/0466* (2013.01); *G01R 1/06733* (2013.01); *G01R 1/07314* (2013.01)

(58) Field of Classification Search
CPC .. G01R 31/2863; G01R 31/2886; G01R 3/00; G01R 1/0466; G01R 1/06733; G01R 1/07314; G01R 1/0458; G01R 1/06722
(Continued)

(56) References Cited

U.S. PATENT DOCUMENTS 5,975,915 A   11/1999   Yamazaki et al.
6,788,080 B1 *   9/2004   Lenz .................. G01R 1/07342
324/754.05
(Continued)

FOREIGN PATENT DOCUMENTS

JP      5-29051 A     2/1993
JP      6-180327 A    6/1994
(Continued)

OTHER PUBLICATIONS

Translation of JPH06180327A (Year: 1994).*
(Continued)

*Primary Examiner* — Christopher P Mcandrew
(74) *Attorney, Agent, or Firm* — Sughrue Mion, PLLC

(57) ABSTRACT

Disclosed is a test socket. The test socket includes a first block comprising a first base member of a conductive material and a first insulating member of an insulating material, a second block comprising a second base member of a conductive material and a second insulating member of an insulating material, a gap member of an insulating material, interposed between the first block and the second block, a first probe supported being in contact with the first base member and being not in contact with the second base member, a second probe supported being not in contact with the first base member and being in contact with the second base member, and electronic parts provided in the gap
(Continued)

member and placed on a conductive path by which the first base member and the second base member are electrically connected.

9 Claims, 10 Drawing Sheets

(51) Int. Cl.
    *G01R 1/067*           (2006.01)
    *G01R 1/073*           (2006.01)

(58) Field of Classification Search
    USPC .................................................. 324/756.05
    See application file for complete search history.

(56) References Cited

U.S. PATENT DOCUMENTS

| | | | |
|---|---|---|---|
| 8,159,251 B2 * | 4/2012 | Sasaki | G01R 1/07314 |
| | | | 324/755.03 |
| 8,749,255 B2 * | 6/2014 | Takeda | G01R 31/2874 |
| | | | 324/750.05 |
| 2008/0088331 A1 | 4/2008 | Yoshida | |
| 2010/0066394 A1 | 3/2010 | Todoroki | |
| 2013/0065455 A1 | 3/2013 | Kawata et al. | |
| 2016/0154024 A1 | 6/2016 | Miyagawa | |
| 2017/0122977 A1 | 5/2017 | Park | |
| 2018/0196096 A1 | 7/2018 | Jeong et al. | |
| 2019/0018045 A1 | 1/2019 | Jeong | |
| 2020/0141980 A1 | 5/2020 | Kim et al. | |
| 2021/0132114 A1 | 5/2021 | Park et al. | |

FOREIGN PATENT DOCUMENTS

| | | | |
|---|---|---|---|
| JP | 10-22024 | A | 1/1998 |
| JP | 11-14699 | A | 1/1999 |
| JP | 2005-180922 | A | 7/2005 |
| JP | 2006-250732 | A | 9/2006 |
| JP | 2008-70146 | A | 3/2008 |
| JP | 2009-129877 | A | 6/2009 |
| JP | 2010-060527 | A | 3/2010 |
| JP | 2011-252766 | A | 12/2011 |
| JP | 2012-159422 | A | 8/2012 |
| JP | 2016-102696 | A | 6/2016 |
| KR | 10-1095907 | B1 | 12/2011 |
| KR | 10-1552552 | B1 | 9/2015 |
| KR | 10-2017-0030783 | A | 3/2017 |
| KR | 10-2017-0095449 | A | 8/2017 |
| KR | 10-2017-0110346 | A | 10/2017 |
| KR | 10-1827860 | B1 | 2/2018 |
| KR | 10-2019-0017427 | A | 2/2019 |
| KR | 10-2044753 | B1 | 11/2019 |
| TW | 201339583 | A | 10/2013 |
| TW | 201723490 | A | 7/2017 |
| WO | 2012/106220 | A1 | 8/2012 |

OTHER PUBLICATIONS

Taiwanese Office Action for TW 110119211, dated Apr. 20, 2022.
Korean Written Decision of Registration for 10-2020-0065853, dated May 24, 2021.
Written Opinion for PCT/KR2021/006641, dated Sep. 29, 2021.
International Search Report for PCT/KR2021/006641, dated Sep. 29, 2021.
Office Action issued Dec. 5, 2023 in Japanese Application No. 2022-572646.

* cited by examiner

[Fig. 1]
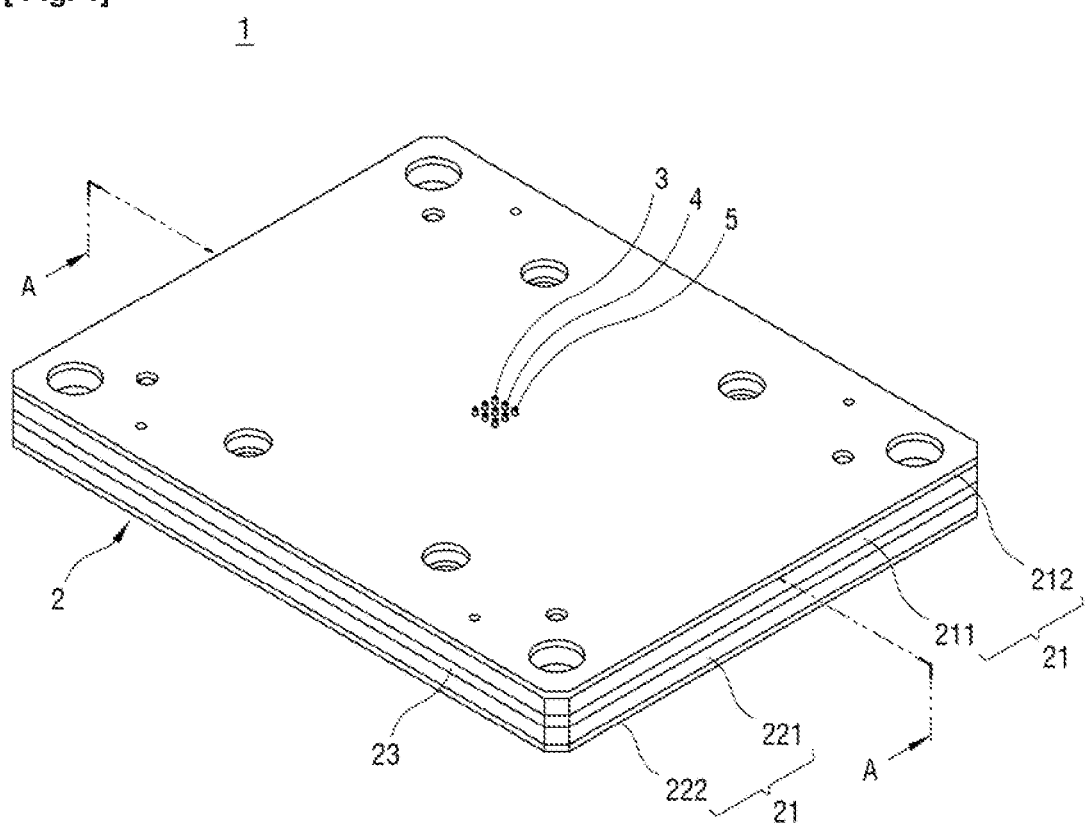

[Fig. 2]
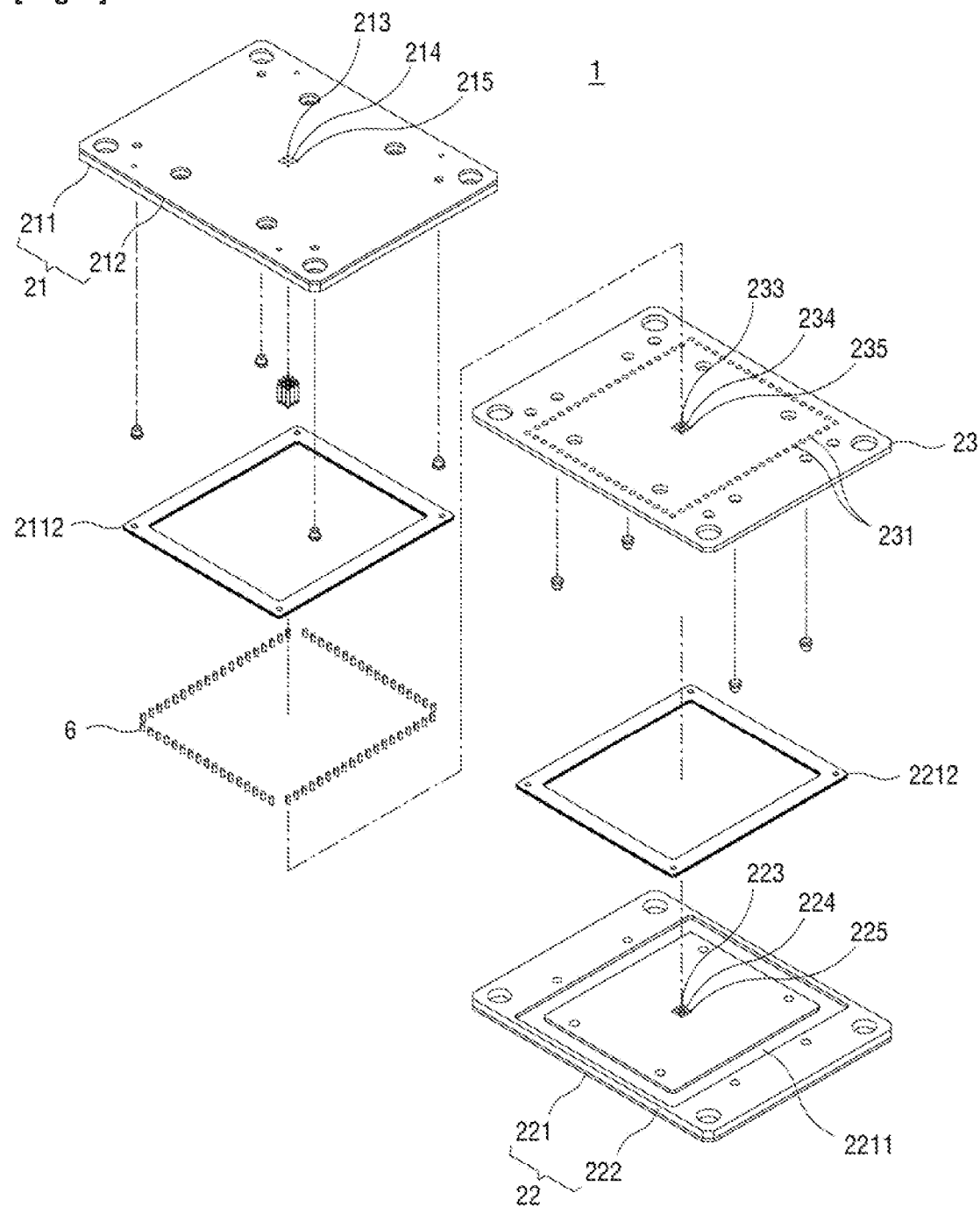

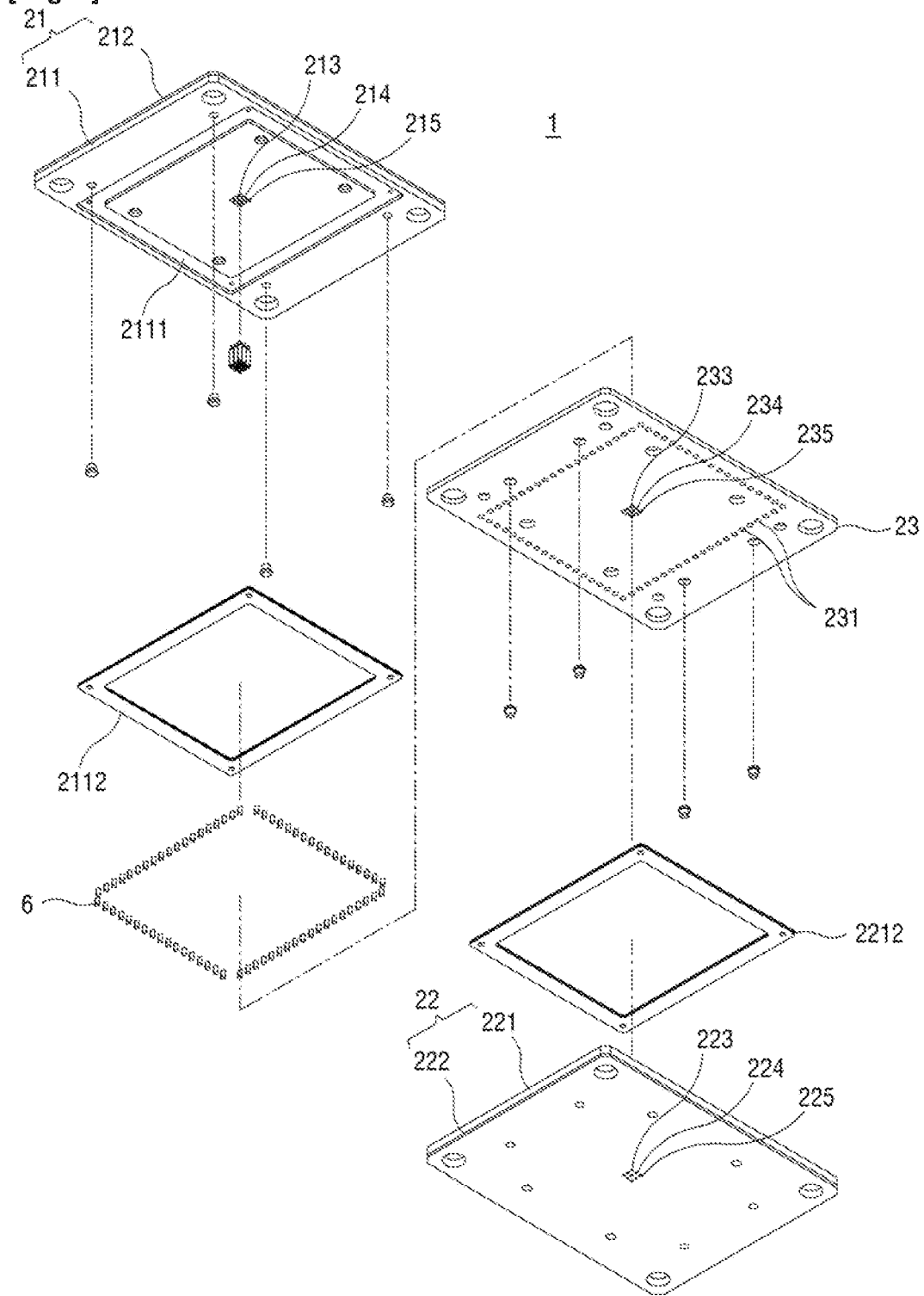

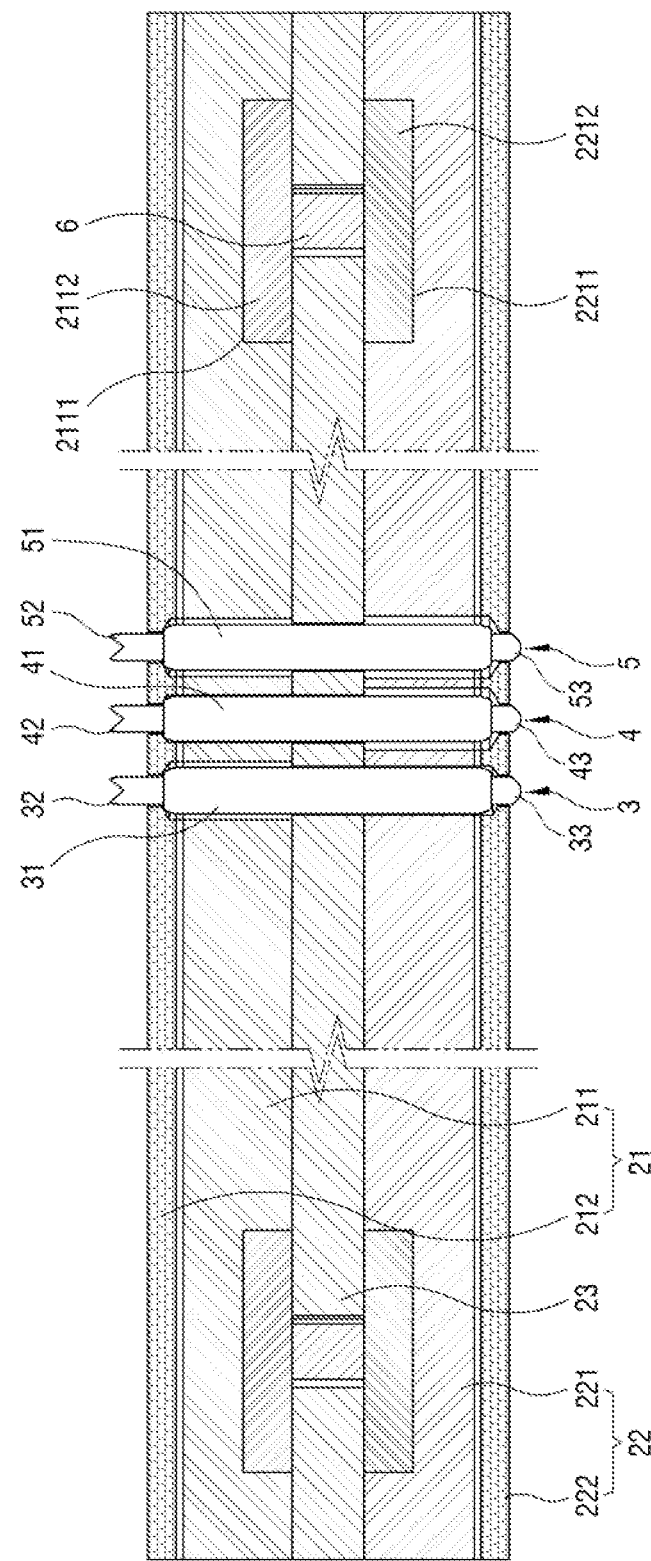
[Fig. 4]

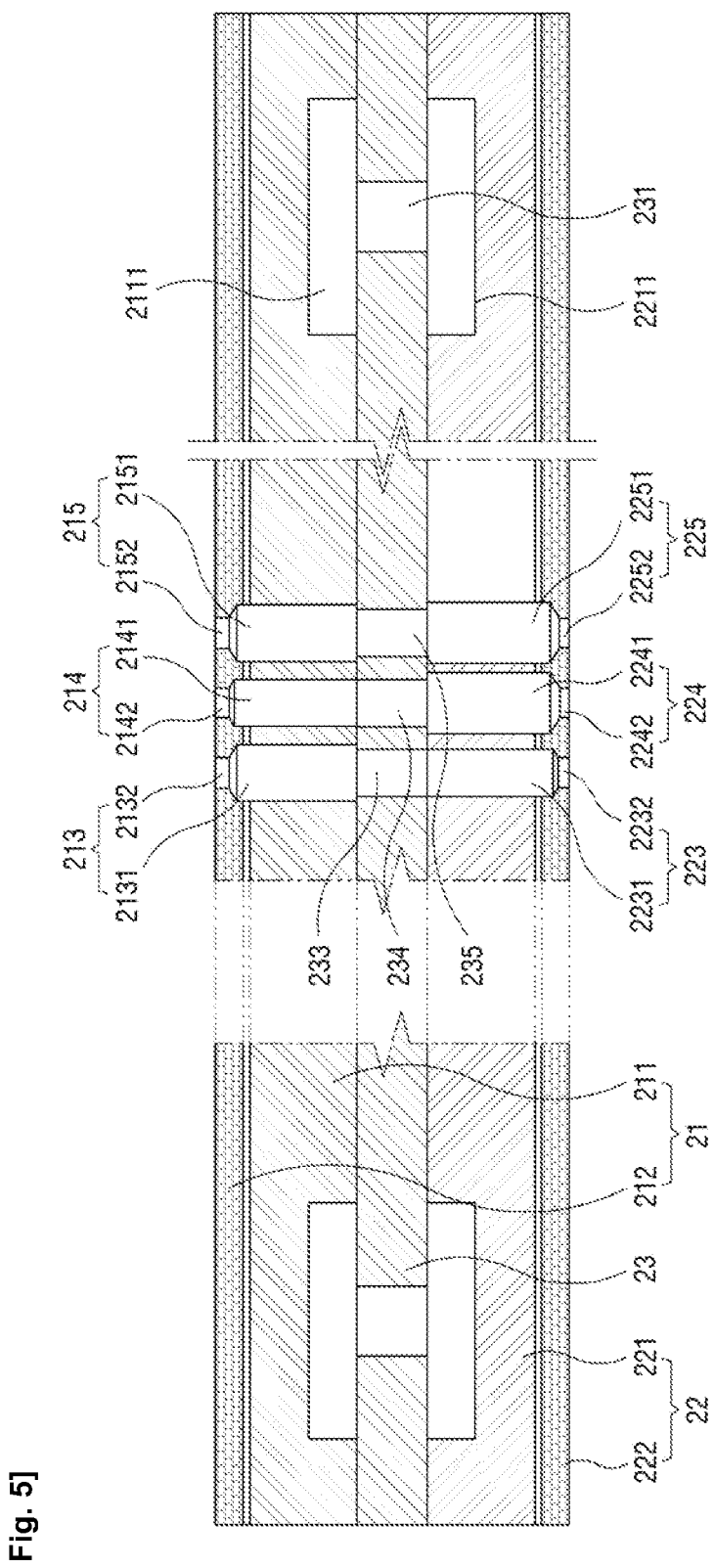
[Fig. 5]

[Fig. 6]
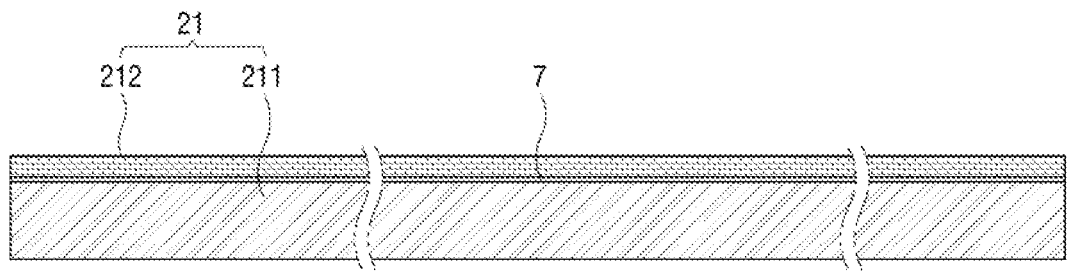
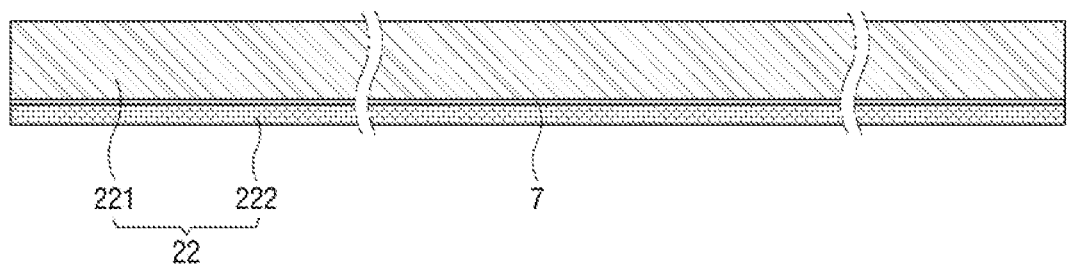

[Fig. 7]
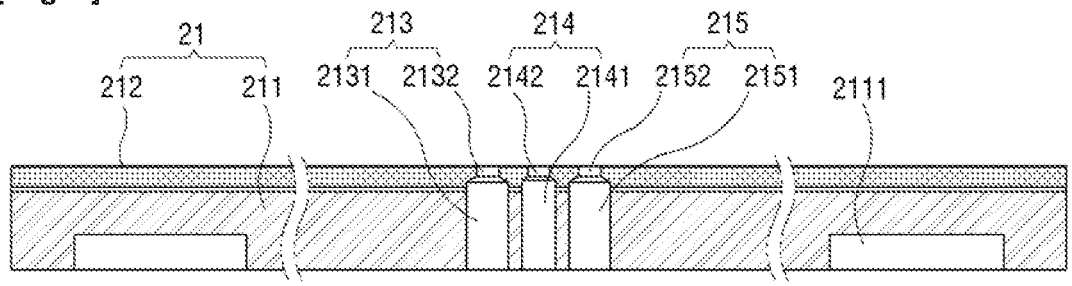
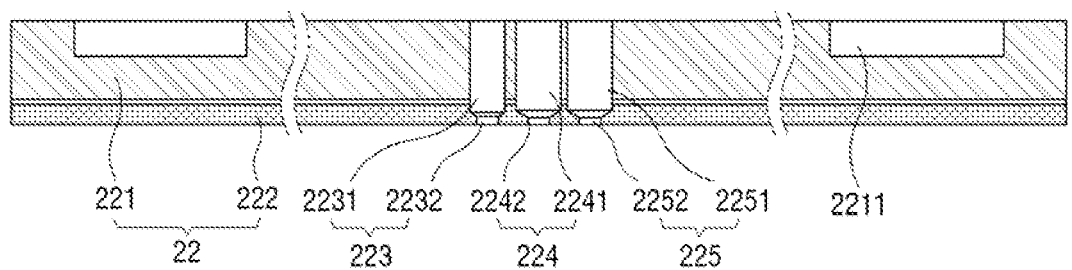
[Fig. 8]
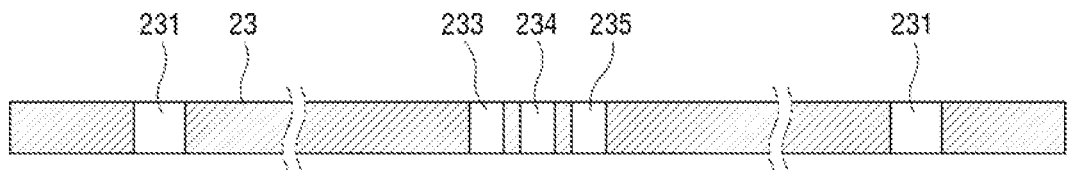

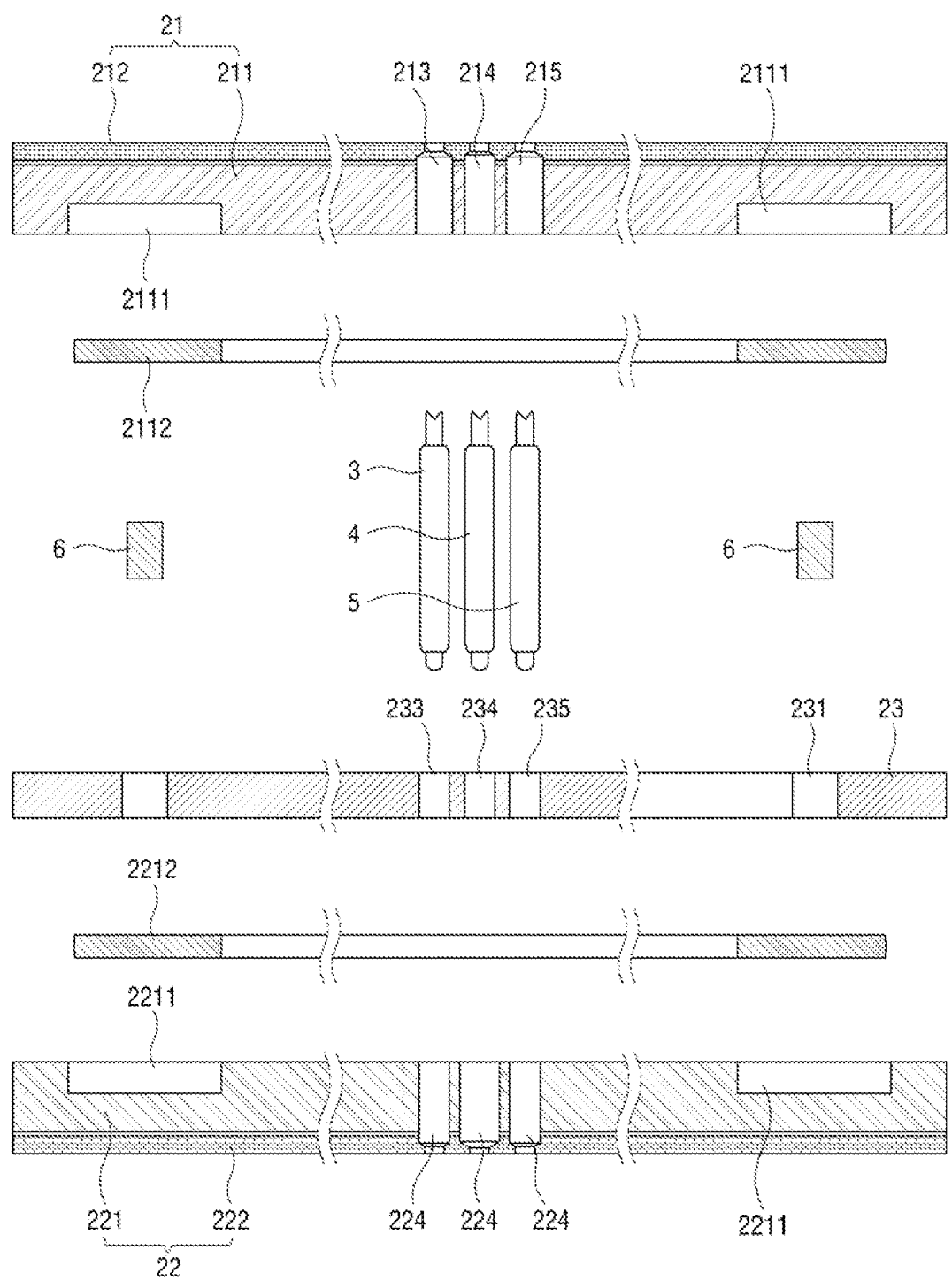
[Fig. 9]

[Fig. 10]
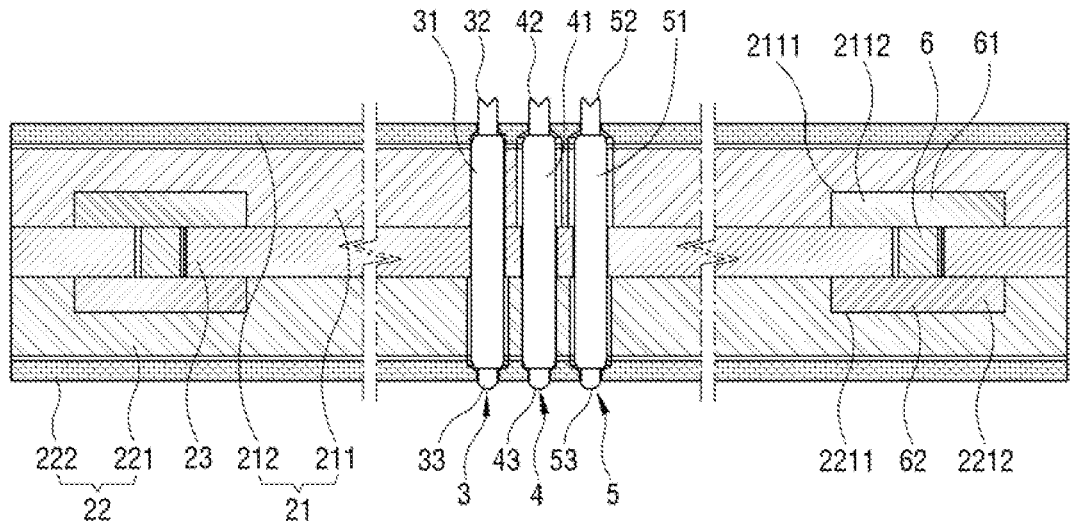
[Fig. 11]
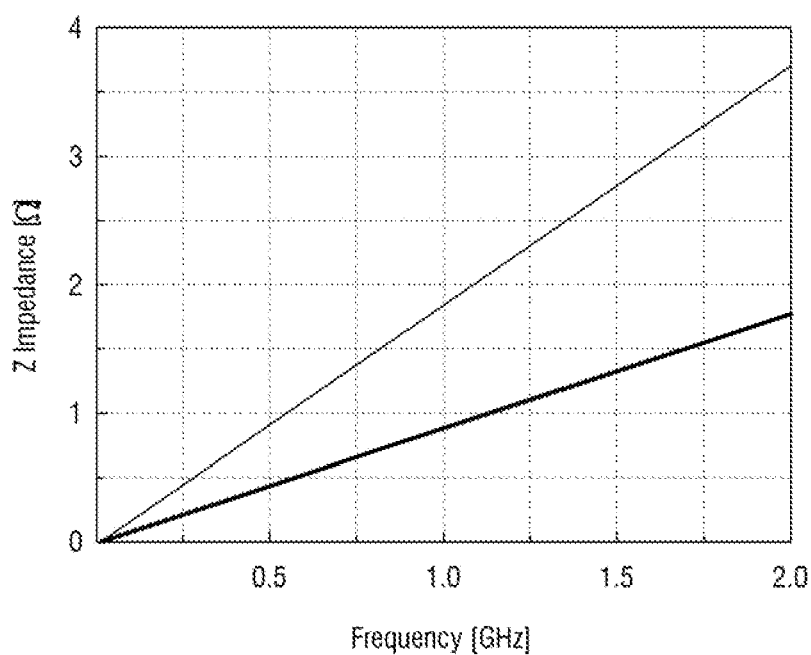

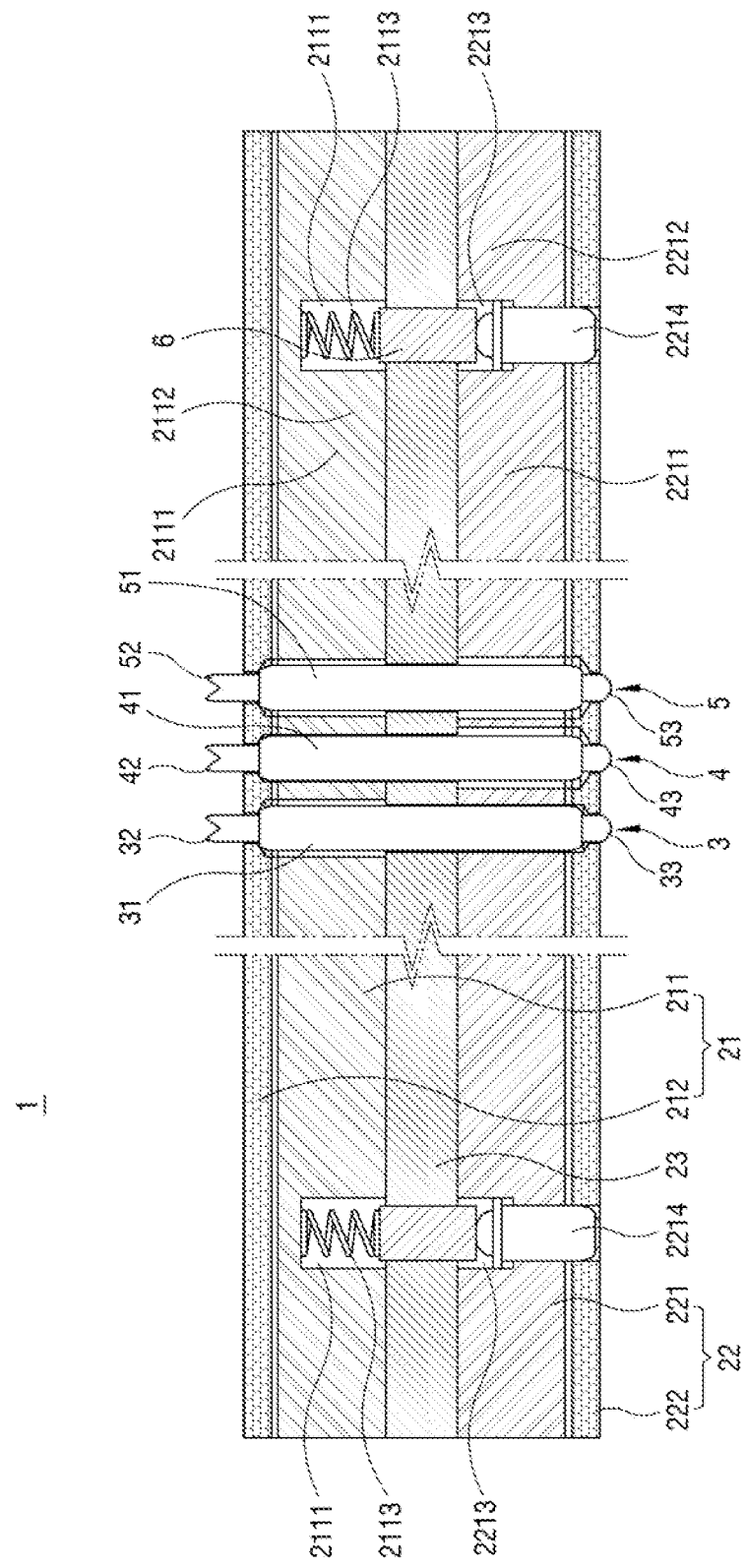
[Fig. 12]

TEST SOCKET

TECHNICAL FIELD

The disclosure relates to a test socket for testing electric characteristics of an object-to-be-tested.

BACKGROUND ART

A semiconductor chip, on which fine and high-integrated electronic circuits are formed, undergoes a test to determine whether each electronic circuit is normal or not, during a manufacturing process. To test the semiconductor chip, a contact probe for a semiconductor test, by which the terminal of the semiconductor chip and a contact point (pad) of a test circuit board for applying a test signal are connected, is used. In general, the terminals of the semiconductor chip have very fine patterns. Therefore, a very fine-sized contact probe should be integrated and supported in a probe supporter to be in contact with and test the terminals having the very fine patterns. It is desirable to shorten the power supply path for the test socket for testing semiconductor chips. Korean Patent No. 10-1552552 has disclosed technology that a printed circuit board (PCB) mounted with electronic parts is placed in a test socket.

In a conventional test socket, the PCB is interposed between an upper supporter for supporting a probe and a lower supporter for supporting an electric conductor, and both terminals of the electronic part mounted onto the PCB are connected to the probe and the electric conductor. However, it is difficult to manufacture such a conventional test socket because a very fine conductive pattern is formed with fine pitch and the PCB needs to be designed to be in contact with the probes and the electric conductors, and a problem of increasing a manufacturing cost arises because the structure of the test socket is very complicated.

DISCLOSURE OF INVENTION

Technical Problem

An aspect of the disclosure is to provide a text socket which has a simple structure and is excellent in power integrity.

Another aspect of the disclosure is to provide a test socket which is excellent in heat dissipation effect and increases current capacity.

Solution to Problem

According to an embodiment of the disclosure, a test socket is provided. The test socket includes a first block comprising a first base member of a conductive material and a first insulating member of an insulating material, a second block comprising a second base member of a conductive material and a second insulating member of an insulating material, a gap member of an insulating material, interposed between the first block and the second block, a first probe supported being in contact with the first base member and being not in contact with the second base member, a second probe supported being not in contact with the first base member and being in contact with the second base member, and electronic parts provided in the gap member and placed on a conductive path by which the first base member and the second base member are electrically connected.

The gap member may comprise a parts-accommodating hole in which a first terminal and a second terminal of the electronic parts are accommodated to be exposed.

The first base member and the second base member may comprise a first groove and a second groove at positions respectively corresponding to the exposed first terminal and the exposed second terminal.

The test socket may further comprise a first terminal contact portion and a second terminal contact portion respectively provided in the first groove and the second groove, and respectively making the first base member and the second base member be electrically connected to the exposed first terminal and the exposed second terminal.

The first terminal contact portion and the second terminal contact portion may comprise a first conductive elastic member and a second conductive elastic member, respectively.

The test socket may further comprise springs respectively provided in the first groove and the second groove, and respectively making the first base member and the second base member be connected to the exposed first terminal and the exposed second terminal.

The first base member may comprise a first-probe accommodating hole to accommodate the first probe without contact and a second-probe accommodating hole to accommodate the second probe with contact, and the second base member comprises a first-probe accommodating hole to accommodate the first probe with contact and a second-probe accommodating hole to accommodate the second probe without contact.

According to another embodiment of the disclosure, a test socket is provided. The test socket includes a first block comprising a first base member of a conductive material and a first insulating member of an insulating material, a second block comprising a second base member of a conductive material and a second insulating member of an insulating material, a gap member of an insulating material, interposed between the first block and the second block, a first probe supported being not in contact with the first base member and being in contact with the second base member, a second probe supported being in contact with the first base member and being not in contact with the second base member and electronic parts provided in the gap member and placed on a conductive path by which the first base member and the second base member are electrically connected.

According to another embodiment of the disclosure, a method of manufacturing a test socket that supports first and second probes retractable in a lengthwise direction. The method includes forming a first block to have a plate shape by adhering a first base member of a conductive material and a first insulating member of an insulating material, forming a second block to have a plate shape by adhering a second base member of a conductive material and a second insulating member of an insulating material, forming first and second probe holes in the first block to support a first side of the first probe without contact and a first side of the second probe with contact, forming third and fourth probe holes in the second block to support a second side of the first probe with contact and a second side of the second probe without contact, forming fifth and sixth probe holes in a gap member of an insulating material to accommodate and support middle portions of the first and second probes, and forming parts-accommodating holes in the gap member of the insulating material to accommodate electronic parts of which first and second terminals are exposed and inserting the first probe in the first probe hole, the third probe hole, and the fifth probe hole, inserting the second probe in the second probe hole, the fourth probe hole, and the sixth probe hole, and coupling the first block and the second block with the gap member therebetween in a state that the electronic parts are inserted in the parts-accommodating hole.

Advantageous Effects of Invention

The method of manufacturing a test socket according to an embodiment of the present invention can reduce the power application path to a simple structure.

In addition, the test socket of the present invention can increase the heat dissipation effect and current capacity by directly contacting the upper and lower brass blocks with the electronic component.

BRIEF DESCRIPTION OF DRAWINGS

FIG. 1 is a perspective view of a test socket according to a first embodiment of the disclosure;

FIG. 2 is an exploded perspective view of the test socket of FIG. 1, viewed from above;

FIG. 3 is an exploded perspective view of the test socket of FIG. 1, viewed from below;

FIG. 4 is a cross-sectional view of the test socket of FIG. 1, taken along line A-A;

FIG. 5 is a cross-sectional view of a socket block of FIG. 1;

FIGS. 6 to 9 are views showing a method of manufacturing the test socket of FIG. 1;

FIG. 10 is a view showing a test socket according to a second embodiment of the disclosure;

FIG. 11 is a graph showing comparison in Z impedance between a conventional coaxial test socket and a test socket according to an embodiment of the disclosure; and FIG. 12 is a view showing a test socket according to a third embodiment of the disclosure.

BEST MODE FOR CARRYING OUT THE INVENTION

Below, embodiments of the disclosure will be described in detail with reference to accompanying drawings.

FIG. 1 is a perspective view of a test socket 1 according to a first embodiment of the disclosure, FIG. 2 is an exploded perspective view of the test socket 1 of FIG. 1, viewed from above, and FIG. 3 is an exploded perspective view of the test socket 1 of FIG. 1, viewed from below.

Referring to FIGS. 1 to 3, the test socket 1 may include a socket block 2; a plurality of probes, for example, a power probe 3, a ground probe 4, a signal probe or radio frequency (RF) probe (below, referred to as the 'signal probe') 5; and an electronic part 6.

The socket block 2 may include an upper block 21, a lower block 22, and a gap member 23 interposed between the upper block 21 and the lower block 22.

The upper block 21 may be formed by integrally adhering a first insulating member 212 to one side of a first base member 211.

The upper block 21 may include a first power probe hole 213, a first ground probe hole 214, and a first signal probe hole 215 to respectively accommodate and support upper portions of the power probe 3, the ground probe 4 and the signal probe 5.

The first base member 211 may be made of a conductive material, for example, brass or the like. The first base member 211 may be formed by applying a conductive material to an insulating material. The first base member 211 may accommodate the power probe 3 with contact, the ground probe 4 without contact, and the signal probe 5 without contact.

The first base member 211 may include a first groove 2111 recessed on a bottom side thereof and surrounding the first power probe hole 213, the first ground probe hole 214 and the first signal probe hole 215, and a first elastic member 2112 filled in the first groove 2111.

The first elastic member 2112 may be made of a conductive material that electrically connects a first terminal of the electronic part 6 and the upper block 21. The first elastic member 2112 may prevent the first terminal of the electronic part 6 from being damaged when the upper block 21, the lower block 22 and the gap member 23 are coupled. The first elastic member 2112 may for example be embodied by a flat spring, a coil spring, etc. made of a conductive material.

The first insulating member 212 may be made of an insulating material, for example, engineering plastic or the like. The first insulating member 212 may support first end portions of the power probe 3, the ground probe 4 and the signal probe 5.

The lower block 22 may be formed by integrally adhering a second insulating member 222 to one side of a second base member 221. The lower block 22 may include a second power probe hole 223, a second ground probe hole 224 and the first signal probe hole 225 to respectively accommodate and support lower portions of the power probe 3, the ground probe 4 and the signal probe 5.

The second base member 221 may be made of a conductive material, for example, brass or the like. The second base member 221 may be formed by applying a conductive material to an insulating material. The second base member 221 may accommodate the power probe 3 without contact, the ground probe 4 with contact, and the signal probe 5 without contact.

The second base member 221 may include a second groove 2211 recessed on a top side thereof and surrounding the second power probe hole 223, the second ground probe hole 224, and the second signal probe hole 225, and a second elastic member 2212 filled in the second groove 2211.

The second elastic member 2212 may be made of a conductive material that electrically connects a second terminal of the electronic part 6 and the lower block 22. The second elastic member 2212 may prevent the second terminal of the electronic part 6 from being damaged when the upper block 21, the lower block 22 and the gap member 23 are coupled. The second elastic member 2212 may for example be embodied by a flat spring, a coil spring, etc. made of a conductive material.

The second insulating member 222 may be made of an insulating material, for example, engineering plastic or the like. The second insulating member 222 may support second end portions of the power probe 3, the ground probe 4 and the signal probe 5.

The gap member 23 may be made of an insulating material, for example, engineering plastic.

The gap member 23 may include a third power probe hole 233, a third ground probe hole 234 and a third signal probe hole 235 that respectively have diameters corresponding to the outer diameters of the power probe 3, the ground probe 4 and the signal probe 5, and respectively accommodate the middle portions of the power probe 3, the ground probe 4 and the signal probe 5.

The gap member 23 may include parts-accommodating holes 231 penetrably formed at positions surrounding the third power probe hole 233, the third ground probe hole 234, and the third signal probe hole 235, and at positions corresponding to the first groove 2111 of the first base member 211 and the second groove 2211 of the second base member 221. The parts-accommodating hole 231 is formed to have a diameter corresponding to the outer diameter of the electronic part 6 and accommodates the electronic part 6.

The gap member 23 may correct an alignment error of a plurality of probes 3, 4 and 5 when the upper block 21 and the lower block 22 are coupled.

FIG. 4 is a cross-sectional view of the test socket 1 of FIG. 1, taken along line A-A.

Referring to FIG. 4, the power probe 3 may be accommodated being not in contact with the first base member 211 and being in contact with the second base member 221, and includes the first end portion supported on the first insulating member 212 and the second end portion supported on the second insulating member 222. In result, the second base member 221 may maintain positive polarity by the power probe 3. The power probe 3 may include a barrel 31, a first plunger 32, a second plunger 33, and a spring (not shown). The first plunger 32 and the second plunger 33 are retractable along a lengthwise direction with the spring therebetween, and partially protrude from the top and bottom sides of the socket block 2, thereby electrically connecting a power contact point of an object-to-be-tested and a power contact point of a test circuit.

The ground probe 4 may be supported being in contact with the first base member 211 and being not in contact with the second base member 221, and include both end portions supported on the first and second insulating members 212 and 222. In result, the first base member 211 may maintain negative polarity by the ground probe 4. The ground probe 4 may include a barrel 41, a first plunger 42, a second plunger 43 and a spring (not shown). The first plunger 42 and the second plunger 43 are retractable along a lengthwise direction with the spring therebetween, and partially protrude from the top and bottom sides of the socket block 2, thereby electrically connecting a ground contact point of the object-to-be-tested and a ground contact point of the test circuit.

The signal probe 5 may be accommodated being not in contact with the first and second base members 211 and 221, and include the first end portion supported on the first insulating member 212 and the second end portion supported on the second insulating member 222. The signal probe 5 may include a barrel 51, a first plunger 52, a second plunger 53, and a spring (not shown). The first plunger 52 and the second plunger 53 are retractable along a lengthwise direction with the spring therebetween, and partially protrude from the top and bottom sides of the socket block 2, thereby electrically connecting a signal contact point of the object-to-be-tested and a signal contact point of the test circuit.

The power probe 3, the ground probe 4 and the signal probe 5 are not limited to the foregoing pogo type but may be any probe as long as it is retractable.

The electronic part 6 may be placed on a conductive path by which the first base member 211 and the second base member 221 are electrically connected. The electronic part 6 may include various parts such as a capacitor, a resistor, an integrated circuit (IC), etc. Below, it will be described by way of example that the electronic part 6 is the capacitor. The capacitor is provided between the second base member 221 having the positive polarity and the first base member 211 having the negative polarity, alternating between charging and discharging when an object-to-be-tested is tested. In other words, electric current charged in a plurality of capacitors provided inside the test socket 1 may be used to supply power to an object-to-be-tested. Like this, test power is supplied through the built-in capacitor of the test socket 1, thereby shortening the power supplying path and minimizing power loss.

FIG. 5 is a cross-sectional view of a socket block 2 of FIG. 1.

Referring to FIG. 5, the upper block 21 may include the first power probe hole 213, the first ground probe hole 214, and the first signal probe hole 215 that respectively accommodate and support the upper portion of the power probe 3 without contact, the upper portion of the ground probe 4 with contact, and the upper portion of the signal probe 5 without contact.

The first power probe hole 213 may include a first power-probe accommodating hole 2131 formed in the first base member 211, and a first power-probe supporting hole 2132 formed in the first insulating member 212. The first power-probe accommodating hole 2131 is formed to have a larger diameter than the barrel 31 of the power probe 3, thereby accommodating the power probe 3 without contact. The first power-probe supporting hole 2132 may support a first end of the barrel 31 of the power probe 3.

The first ground probe hole 214 may include a first ground-probe accommodating hole 2141 formed in the first base member 211, and a first ground-probe supporting hole 2142 formed in the and the first insulating member 212. The first ground-probe accommodating hole 2141 is formed to have the same diameter as the barrel 41 of the ground probe 4, thereby accommodating the ground probe 4 with contact. The first ground-probe supporting hole 2142 may support a first end of the barrel 41 of the ground probe 4.

The first signal probe hole 215 may include a first signal-probe accommodating hole 2151 formed in the first base member 211, and a first signal-probe supporting hole 2152 formed in the first insulating member 212. The first signal-probe accommodating hole 2151 is formed to have a larger diameter than the barrel 51 of the signal probe 5, thereby accommodating the signal probe 5 without contact. The first signal-probe supporting hole 2152 may support a first end of the barrel 51 of the signal probe 5.

The lower block 22 may include the second power probe hole 223, the second ground probe hole 224, and the second signal probe hole 225 to respectively accommodate and support the lower portion of the power probe 3 with contact, the lower portion of the ground probe 4 without contact, and the lower portion of the signal probe 5 without contact.

The second power probe hole 223 may include a second power-probe accommodating hole 2231 formed in the second base member 221, and a second power-probe supporting hole 2232 formed in the second insulating member 222. The second power-probe accommodating hole 2231 is formed to have the same diameter as the barrel 31 of the power probe 3, thereby accommodating the power probe 3 with contact. The second power-probe supporting hole 2232 may support a second end of the barrel 31 of the power probe 3.

The second ground probe hole 224 may include a second ground-probe accommodating hole 2241 formed in the second base member 221, and a second ground-probe supporting hole 2242 formed in the second insulating member 222. The second ground-probe accommodating hole 2241 is formed to have a larger diameter than the barrel 41 of the ground probe 4, thereby accommodating the ground probe 4 without contact. The second ground-probe supporting hole 2242 may support a second end of the barrel 41 of the ground probe 4.

The second signal probe hole 225 may include a second signal-probe accommodating hole 2251 formed in the second base member 221, and a second signal-probe supporting hole 2252 formed in the second insulating member 222. The second signal-probe accommodating hole 2251 is formed to have a larger diameter than the barrel 51 of the signal probe 5, thereby accommodating the signal probe 5 without contact. The second signal-probe supporting hole 2252 may support a second end of the barrel 51 of the signal probe 5.

The gap member 23 may include the third power probe hole 233, the third ground probe hole 234, and the third signal probe hole 235 that respectively accommodate and support the middle portions of the power probe 3, the ground probe 4 and the signal probe 5 with contact.

The third power probe hole 233 is formed to have the same diameter as the barrel 31 of the power probe 3, thereby accommodating the power probe 3 with contact.

The third ground probe hole 234 is formed to have the same diameter as the barrel 41 of the ground probe 4, thereby accommodating the ground probe 4 with contact.

The third signal probe hole 235 is formed to have the same diameter as the barrel 51 of the signal probe 5, thereby accommodating the signal probe 5 with contact.

The first base member 211 may include a first groove 2111, which is shaped like a quadrangular band and accommodates the first elastic member 2112, on the bottom side thereof, i.e., on the surface to which the gap member 23 is coupled.

The second base member 221 may include a second groove 2211, which is shaped like a quadrangular band and accommodates the second elastic member 2212, on the top side thereof, i.e., on the surface to which the gap member 23 is coupled.

The gap member 23 may include the parts-accommodating hole 231 to accommodate the electronic part 6. The parts-accommodating hole 231 is formed to have the same diameter as the electronic part 6, thereby firmly supporting the electronic part 6.

FIGS. 6 to 9 are views showing a method of manufacturing the test socket 1 of FIG. 1.

As shown in FIG. 6, the first insulating member 2122 is adhered to the top side of the first base member 211, thereby forming the upper block 21. Likewise, the second insulating member 222 is adhered to the bottom side of the second base member 221, thereby forming the lower block 22. Here, the adhesion may for example be performed using a thermosetting adhesive sheet 7, or using insert injection molding.

As shown in FIG. 7, a drill may for example be used to form the first power probe hole 213, the first ground probe hole 214, and the first signal probe hole 215 on the upper block 21, and form the second power probe hole 223, the second ground probe hole 224, and the second signal probe hole 225 on the lower block 22. Further, the first and second grooves 2111 and 2211 are formed to insert the first and second elastic members 2112 and 2212 in the upper and lower blocks 21 and 22, respectively.

As shown in FIG. 8, the parts-accommodating hole 231 for accommodating and supporting the electronic part 6, and the third power probe hole 233, the third ground probe hole 234 and the third signal probe hole 235 for respectively accommodating and supporting the middle portions of the power probe 3, the ground probe 4 and the signal probe 5 may be formed in the gap member 23 by for example a drill.

As shown in FIG. 9, the power probe 3, the ground probe 4, the signal probe 5 and the electronic part 6 are respectively inserted in the first to third power probe holes 213, 223 and 233, the first to third ground probe hole 214, 224 and 234, the first to third signal probe holes 215, 225 and 235, and the parts-accommodating hole 231. The first and second elastic members 2112 and 2212 are respectively inserted in the first and second grooves 2111 and 2211, and then the upper block 21 and the lower block 22 are coupled with the gap member 23 therebetween.

As described above, the first power probe hole 213, the first ground probe hole 214 and the first signal probe hole 215 are drilled in the upper block 21 at a time in the state that the first base member 211 and the first insulating member 212 are being coupled, and the second power probe hole 223, the second ground probe hole 224 and the second signal probe hole 225 are drilled in the lower block 22 at a time in the state that the second base member 221 and the second insulating member 222 are being coupled, thereby reducing an error due to processing and alignment even though many probe holes are formed in the test socket 1. Therefore, the signal probe 5 can be supported being aligned with the central axis of the first to third signal probe holes 215, 225 and 235, and thus improved in insertion loss, return loss, crosstalk or isolation, Z-impedance, inductance and the like characteristics.

FIG. 10 is a view showing a test socket 2 according to a second embodiment of the disclosure;

Referring to FIG. 10, the power probe 3 may be supported in the upper block 21 with contact, and supported in the lower block 22 without contact. Further, the ground probe 4 may be supported in the upper block 21 without contact, and supported in the lower block 22 with contact. Therefore, during the test, the upper block 21 maintains the positive polarity, and the lower block 22 maintains the negative polarity, so that the capacitor placed on the conductive path by which the upper block 21 and the lower block 22 are electrically connected can alternate between charging and discharging.

FIG. 11 is a graph showing comparison in Z impedance between a conventional coaxial test socket and a test socket according to an embodiment of the disclosure.

In the test socket 1, it is desired that the Z-impedance is as low as possible. Referring to FIG. 11, the conventional coaxial test socket has a Z-impedance of 1.83 at a frequency of 1 GHz, and the test socket according to an embodiment of the disclosure has a Z-impedance of 0.86 at a frequency of 1 GHz, which is merely half the conventional Z-impedance.

FIG. 12 is a view showing a test socket 1 according to a third embodiment of the disclosure. Below, the same elements as those of the test socket 1 according to the first embodiment shown in FIG. 4 will be given the same reference numerals, and descriptions thereof will be omitted.

Referring to FIG. 12, the upper block 21 may include the first groove 2111 recessed on the bottom side of the first base member 211, and a spring 2113 put in the first groove 2111.

The lower block 22 may include a contact member 2214 made of a conductive material and filled in a through hole 2213 penetrating the first groove 2111 at a corresponding position.

The contact member 2214 includes a lower end portion to be in contact with the top side of the test circuit board (not shown).

When there are many electronic parts 6, a plurality of springs 2113 applies very high pressure. If a groove is formed instead of the through hole, high pressure is applied to the lower block 22, thereby causing a problem of decoupling the upper block 21 and the lower block 22 or widening a gap between the upper block 21 and the lower block 22. Therefore, the contact member 2214 is inserted in the through hole 2213, so that the pressure applied to the spring 2113 can be applied to the test circuit board being in contact with the contact member 2214.

According to an embodiment of the disclosure, a method of manufacturing a test socket shortens a power supplying path with a simple structure.

Further, a test socket according to an embodiment improves a heat dissipation effect and current capacity because upper and lower brass blocks are in direct contact with electronic parts.

In the foregoing description, merits of the disclosure have been described with reference to specific embodiments. However, it will be obvious to a person having ordinary skill in the art that various modifications and changes can be made without departing from the scope of the disclosure defined in appended claims. Therefore, the descriptions and drawings need to be construed as an example of the disclosure rather than limitations of the disclosure. All such possible modifications should be made within the scope of the disclosure.

The invention claimed is:

1. A test socket comprising: a first block comprising a first base member of a conductive material and a first insulating member of an insulating material; a second block comprising a second base member of a conductive material and a second insulating member of an insulating material; a gap member of an insulating material, interposed between the first block and the second block; a first probe supported being in contact with the first base member and being not in contact with the second base member; a second probe supported being not in contact with the first base member and being in contact with the second base member; and electronic parts provided in the gap member and placed on a conductive path by which the first base member and the second base member are electrically connected.

2. The test socket according to claim 1, wherein the gap member comprises a parts-accommodating hole in which a first terminal and a second terminal of the electronic parts are accommodated to be exposed.

3. The test socket according to claim 2, wherein the first base member and the second base member comprise a first groove and a second groove at positions respectively corresponding to the exposed first terminal and the exposed second terminal.

4. The test socket according to claim 3, further comprising a first terminal contact portion and a second terminal contact portion respectively provided in the first groove and the second groove, and respectively making the first base member and the second base member be electrically connected to the exposed first terminal and the exposed second terminal.

5. The test socket according to claim 4, wherein the first terminal contact portion and the second terminal contact portion comprise a first conductive elastic member and a second conductive elastic member, respectively.

6. The test socket according to claim 3, further comprising springs respectively provided in the first groove and the second groove, and respectively making the first base member and the second base member be connected to the exposed first terminal and the exposed second terminal.

7. The test socket according to claim 1, wherein the first base member comprises a first-probe accommodating hole to accommodate the first probe without contact and a second-probe accommodating hole to accommodate the second probe with contact, and the second base member comprises a first-probe accommodating hole to accommodate the first probe with contact and a second-probe accommodating hole to accommodate the second probe without contact.

8. A test socket comprising: a first block comprising a first base member of a conductive material and a first insulating member of an insulating material; a second block comprising a second base member of a conductive material and a second insulating member of an insulating material; a gap member of an insulating material, interposed between the first block and the second block; a first probe supported being not in contact with the first base member and being in contact with the second base member; a second probe supported being in contact with the first base member and being not in contact with the second base member; and electronic parts provided in the gap member and placed on a conductive path by which the first base member and the second base member are electrically connected.

9. A method of manufacturing a test socket that supports first and second probes retractable in a lengthwise direction, the method comprising: forming a first block to have a plate shape by adhering a first base member of a conductive material and a first insulating member of an insulating material; forming a second block to have a plate shape by adhering a second base member of a conductive material and a second insulating member of an insulating material; forming first and second probe holes in the first block to support a first side of the first probe without contact and a first side of the second probe with contact; forming third and fourth probe holes in the second block to support a second side of the first probe with contact and a second side of the second probe without contact; forming fifth and sixth probe holes in a gap member of an insulating material to accommodate and support middle portions of the first and second probes, and forming parts-accommodating holes in the gap member of the insulating material to accommodate electronic parts of which first and second terminals are exposed; and inserting the first probe in the first probe hole, the third probe hole, and the fifth probe hole, inserting the second probe in the second probe hole, the fourth probe hole, and the sixth probe hole, and coupling the first block and the second block with the gap member therebetween in a state that the electronic parts are inserted in the parts-accommodating hole.

\* \* \* \* \*